United States Patent [19]

Desbiens et al.

[11] Patent Number: 4,849,344

[45] Date of Patent: Jul. 18, 1989

[54] ENHANCED DENSITY MODIFIED ISOPLANAR PROCESS

[75] Inventors: Donald J. Desbiens, Sebago Lake, Me.; John W. Eldridge, Newport Beach, Calif.; Paul J. Howell, Federal Way, Wash.

[73] Assignee: Fairchild Semiconductor Corporation, Santa Clara, Calif.

[21] Appl. No.: 265,301

[22] Filed: Oct. 27, 1988

Related U.S. Application Data

[63] Continuation of Ser. No. 940,573, Dec. 11, 1986, abandoned.

[51] Int. Cl.[4] .................................... H01L 21/306
[52] U.S. Cl. .................................... 437/31; 437/228; 437/200; 437/245; 437/233; 148/DIG. 47
[58] Field of Search .................... 437/200, 63, 67, 31, 437/32, 33, 193, 203, 238, 233, 228, 245

[56] References Cited

U.S. PATENT DOCUMENTS

| | | | |
|---|---|---|---|
| 3,648,125 | 3/1972 | Peltzer | 317/235 |
| 3,889,359 | 6/1975 | Rand | 148/DIG. 147 |
| 4,384,301 | 3/1983 | Tasch, Jr. et al. | 148/DIG. 147 |
| 4,400,865 | 8/1983 | Gath et al. | 437/31 |
| 4,498,227 | 2/1985 | Howell et al. | 29/976 B |
| 4,506,439 | 3/1985 | Pliskin et al. | 437/67 |
| 4,521,952 | 6/1985 | Riseman | 437/200 |
| 4,545,116 | 10/1985 | Lau | 437/200 |
| 4,593,454 | 6/1986 | Bandrant et al. | 437/200 |
| 4,609,568 | 9/1986 | Koh et al. | 427/85 |
| 4,619,038 | 10/1986 | Pintchovski | 437/200 |
| 4,622,735 | 11/1986 | Shibata | 437/200 |

OTHER PUBLICATIONS

Shibata et al., "An Optimally designed Process . . . ", IEDM Technical Digest, 1981, pp. 647–650.
Tsang et al., "Fabrication of . . . ", IEEE J. Solid-State Cicuits, vol. SC-17#2, Apr. 82, pp. 220–226.
Chao et al, "Stepped Oxide". . . IBM TDB, vol. 26, #7B, Dec. 1983, pp. 3842–3844.
Zarowin, C., "Plasma Etch Anisotropy . . . ", J. Electrochem Soc., vol. 130, No. 5, May 1983, pp. 1144–1152.

Primary Examiner—Brian E. Hearn
Assistant Examiner—Kevin McAndrews
Attorney, Agent, or Firm—Lee Patch; Mark A. Aaker; Daniel H. Kane, Jr.

[57] ABSTRACT

An improved process for fabricating modified isoplanar integrated circuits with enhanced density incorporates a number of interactive and co-acting process steps. First, oxide isolation of epitaxial islands is effected in a two step process, forming a thin thermally grown oxide layer (32), over the surfaces of shallow trenches and then filling the shallow trenches with deposited low temperature oxide (34). Second, an enhanced single polycrystalline or polysilicon layer process uses a blanket implant, eliminates certain masking and etching steps, and defines the polycrystalline layer. Third, a new method and structure is provided for dielectrically isolating and separating contact locations on different surface levels of the integrated circuit structure adjacent to step locations between the surface levels. Finally, a new method constitutes all of the electrical contact locations for the elements of the integrated circuit structure at the same substantially isoplanar level.

11 Claims, 4 Drawing Sheets

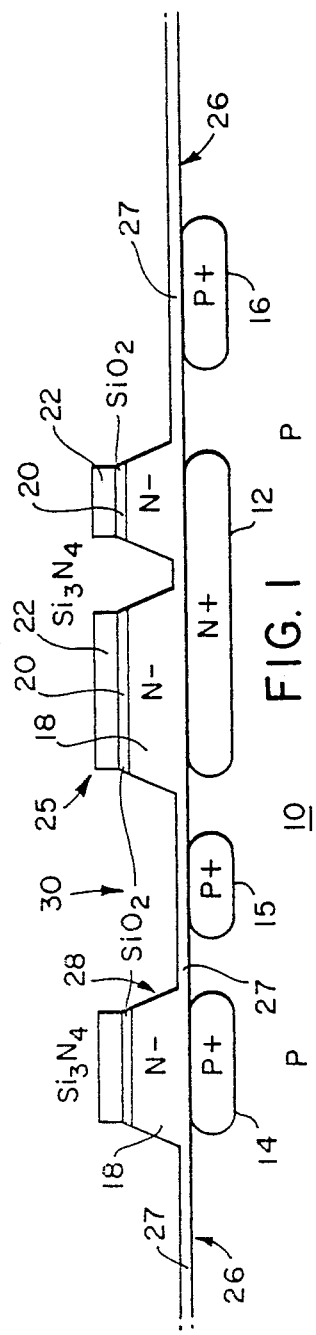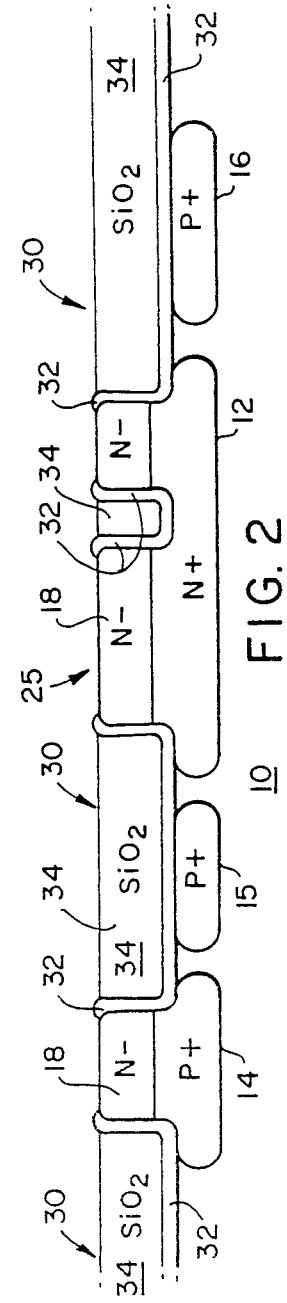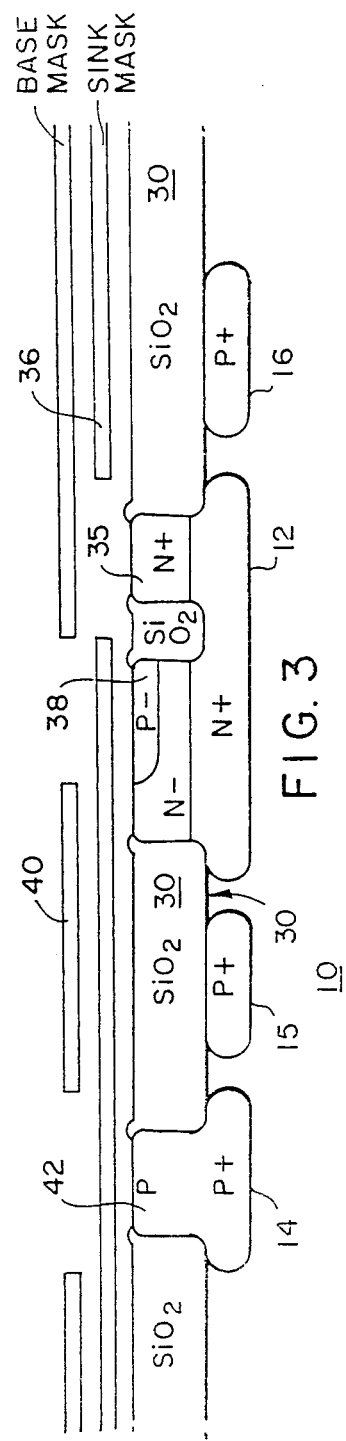

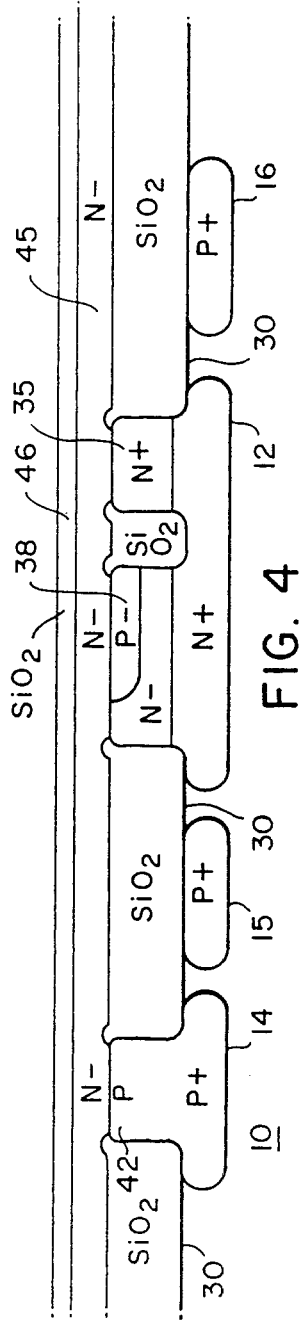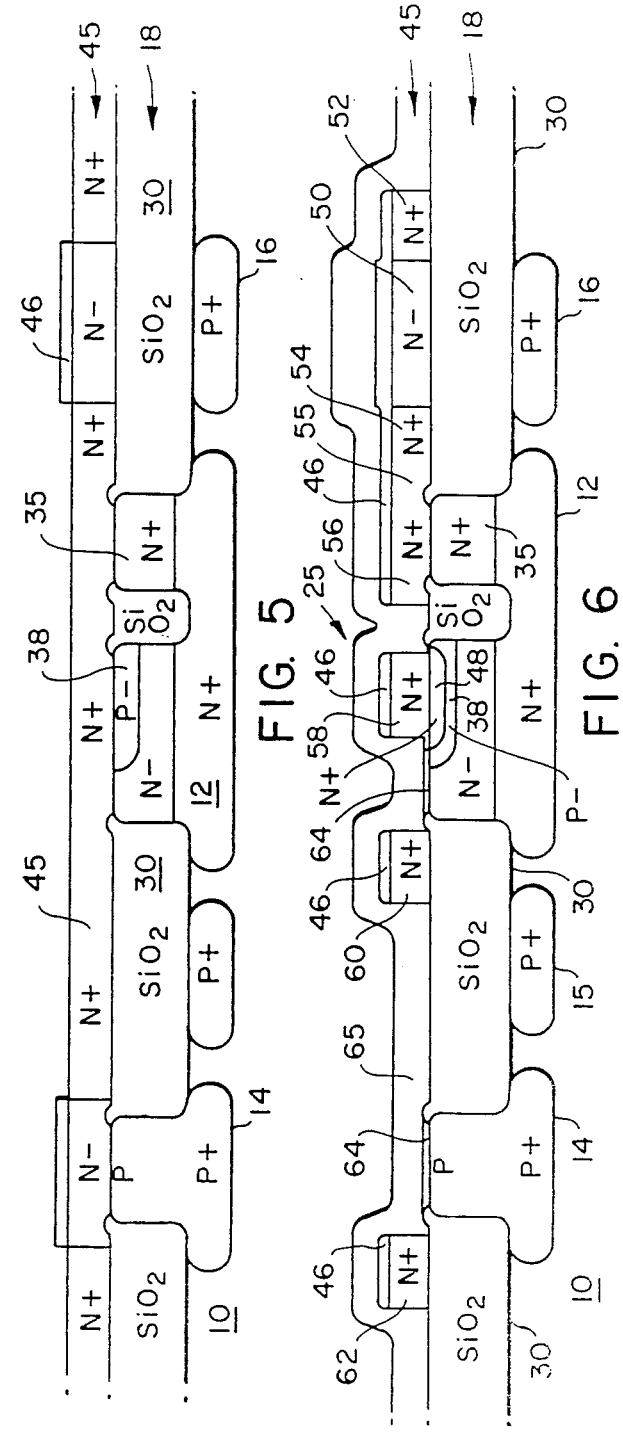

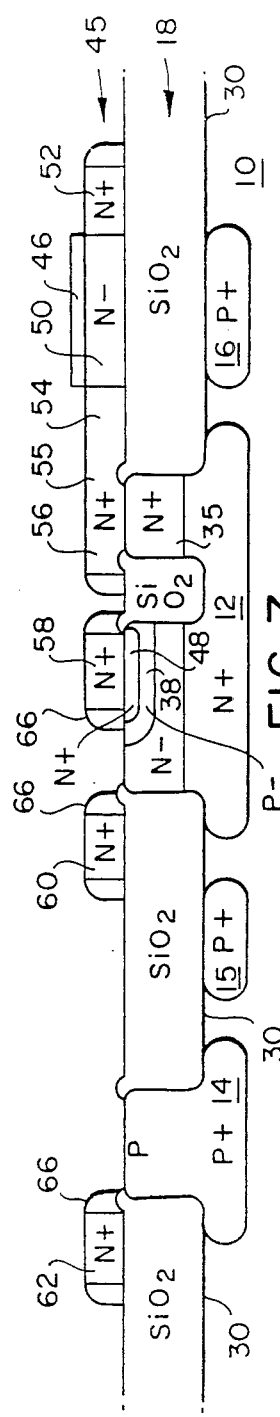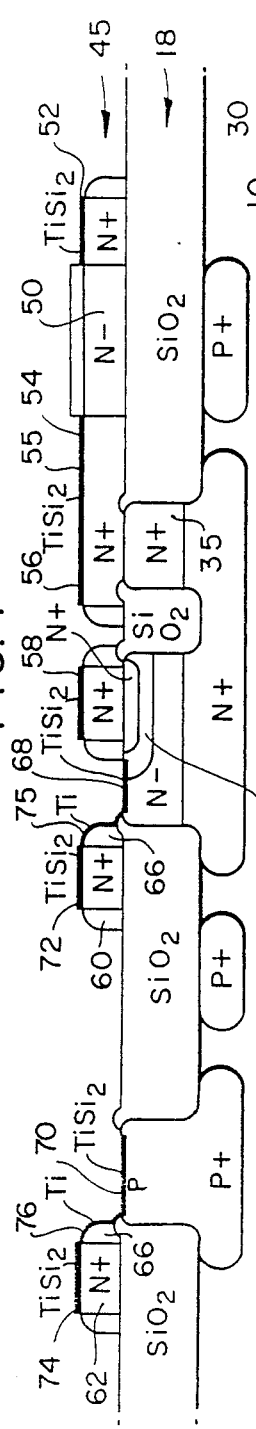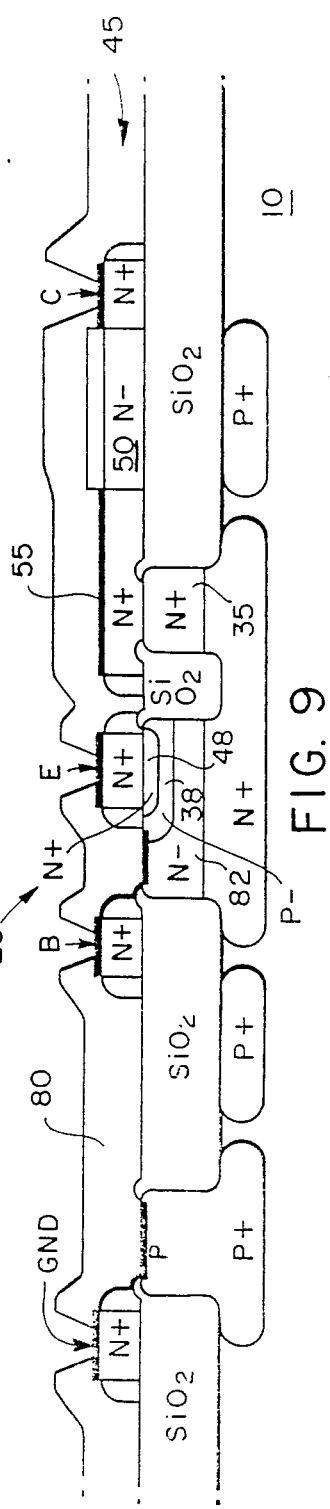

ENHANCED DENSITY MODIFIED ISOPLANAR PROCESS

This application is a continuation of application Ser. No. 940,573, filed Dec. 11, 1986, now abandoned.

TECHNICAL FIELD

This invention relates to new methods for fabricating bipolar modified isoplanar integrated circuit structures to minimize geometry and enhance density for very large scale integration. In particular the invention provides new methods for: oxide isolation of epitaxial islands, limiting encroachment of isolation oxide regions into the epitaxial islands or mesas, thereby permitting smaller epitaxial island or mesa dimensions; enhanced and more efficient use of a single polycrystalline layer in forming higher density transistor, resistor and related circuit elements of the integrated circuit structure; electrical isolation and separation of electrical contact locations on different levels of an integrated circuit structure with minimum spacing between contact locations, and in particular isolation of contact locations on the monosilicon epitaxial layer from contact locations on the overlying polysilicon layer; and transfer of electrical contact locations on different levels of the integrated circuit structure to the same substantially isoplanar level.

BACKGROUND ART

The classical isoplanar process for fabrication of integrated circuits is described, for example in the Peltzer U.S. Pat. No. 3,648,125. An epitaxial layer of semiconductor material of one conductivity type is deposited over a substrate of semiconductor material of opposite conductivity type forming an isolation junction or interface extending laterally through the structure. The epitaxial layer is subdivided into a plurality of epitaxial islands, pedestals or mesas separated by isolation oxide regions. The active and passive integrated circuit elements are then formed in the epitaxial islands by a complex sequence of masking, etching and diffusion steps.

The isoplanar process for fabrication of integrated circuit structures has been the subject of continuing evolution and improvement. The Howell et al. U.S. Pat. No. 4,498,227 describes an improved isoplanar process which fully integrates ion implant methods into the isoplanar process and fully substitutes ion implant methods for diffusion methods. The use of passivating and protective oxide and nitride layers over the epitaxial layer throughout the fabrication process is also described. Developments have also continued in the arrangement of other structures and elements including, for example, the buried collector layer regions and channel stop regions of the substrate, etc.

Further improvements in the isoplanar process include the incorporation of one or more polycrystalline semiconductor material layers or polysilicon layers in the fabrication process for constituting the active and passive elements of the integrated circuit structure. For example in the single layer polysilicon emitter bipolar process a polysilicon layer is formed over the monosilicon epitaxial layer for establishing the emitter region of transistors and related elements of the integrated circuit structure including electrical contact locations. In the "single poly" emitter technologies all electrical contacts to elements of the integrated circuit structure are made through the polysilicon layer at the same level requiring extra masking and implanting steps.

A number of problems can be identified in the improved isoplanar processes for example during isolation of the epitaxial islands with isolation oxide regions. In conventional isolation processes, a substantial portion of the silicon of the epitaxial islands may be consumed during growth of thermal oxide from the silicon in regions between the epitaxial islands. The loss of silicon from the epitaxial islands during thermal growth of isolation oxide can amount to for example $2\mu$ around the sides of the islands or mesas. During earlier years in the of development of the isoplanar process with epitaxial island sizes in the range of $20\mu$, this loss was acceptable. As epitaxial island or mesa sizes have decreased with large scale integration from $20\mu$ to $6\mu$ wide and smaller, the loss by encroachment into the epitaxial islands can amount to as great as 40 to 60% of the islands. The total encroachment includes not only the losses from isolation oxidation but also from photolithography and etching.

One method seeking to eliminate encroachment into the epitaxial islands in large scale integration, currently under development, is "trench technology" or "groove technology". According to the trench technology, the epitaxial islands are first separated by etching unidirectionally through the layers of the integrated circuit structure including the epitaxial monosilicon layer and any buried collector layer region into the substrate of semiconductor material. The trenches are etched using an anisotropic plasma etch through all layers for example to a depth of $4\mu$ with no encroachment into the epitaxial islands. A difficulty with growing thermal isolation oxide in the trenches however is that the thermal oxidation produces stresses and defects at corners of the trenches which propagate into the epitaxial islands. As a result, the trenches are instead filled with oxide deposits such as low temperature oxide or plasma enhanced chemical vapor deposition to avoid stresses and defects. However, deposition of oxide or other dielectric into the trenches instead of the thermal growth of oxide introduces contaminants such as sodium with consequent parasitic MOS effects between the islands. Moreover, it is difficult to obtain good ohmic contact for the ground substrate contacts. The trench or groove technology is not yet suitable for bipolar technologies.

A disadvantage of the conventional polycrystalline layer procedures for defining and completing the integrated circuit elements is that additional masking, etching and implanting steps are required during wafer fabrication. Typically separate masking, etching and implant sequences are required for N− implants for resistors, N+ implants for emitter, collector sink and resistor contact locations, and P+ implants for base contact locations and ground contact locations. Furthermore full advantage is not taken of the properties of the polysilicon layer, either low resistance or high resistance, in constituting the final structure of the integrated circuits.

To avoid the additional masking steps accompanying introduction of a polycrystalline silicon layer or polysilicon layer in addition to the monocrystalline silicon or monosilicon epitaxial layer, electrical contact locations for the integrated circuit elements may result at two different levels across the surface of the integrated circuit. For example the contact locations for circuit elements of semiconductor material of first conductivity type such as P type silicon ground contacts and transistor base contacts may be formed in the monosilicon epitaxial layer at a first level or lower surface level while emitter, collector sink, and resistor contacts of semiconductor material of second conductivity type such as N type silicon contacts may be formed in the polycrystalline layer at a second level or upper surface level.

This departure from the true isoplanar process with electrical contact locations of integrated circuit elements on two surface levels with step locations between the surface levels makes it difficult to achieve effective electrical isolation of contacts in the vicinity of step locations under the constraints of spacing and size required by very large scale integration. Furthermore, subsequent masking, etching and deposition steps for example for the final metal contact masking must be carried out at two levels.

OBJECTS OF THE INVENTION

It is therefore an object of the present invention to provide an improved and modified bipolar isoplanar process for fabricating integrated circuit structures which limits and minimizes encroachment into the monosilicon epitaxial islands or mesas during formation of the isolation oxide regions. The invention seeks to limit isolation oxide encroachment by a novel synthesis and application of features from isoplanar and trench technologies while avoiding the disadvantages of each.

Another object of the invention is to provide enhanced use of a single polycrystalline semiconductor material layer in constituting the integrated circuit elements, and to reduce the number of masking and etching steps required in implementing the polycrystalline or polysilicon layer. The traditional single layer polysilicon emitter bipolar process is enhanced for greater utilization and definition of the polysilicon layer and removal of portions of the polysilicon layer to expose contact locations on the monosilicon epitaxial layer.

A further object of the invention is to provide a new integrated circuit structure with contact locations at different surface levels and a new method for electrically isolating and separating electrical contact locations formed on different levels of the integrated circuit structure. In particular it is the object of the invention to effectively isolate and separate contact locations of semiconductor material of first conductivity type, for example P type silicon, formed in the lower surface level monosilicon epitaxial layer from contact locations of semiconductor material of second conductivity type, for example N type silicon, formed in the upper surface level of the polycrystalline layer while minimizing the spacing required between contact locations on different levels.

Yet another object of the invention is to provide a new method for finishing integrated circuit structures having contact locations of circuit elements at least at two different levels, for example a first or lower surface level monosilicon epitaxial layer and a second or upper level polycrystalline layer. The invention seeks to constitute all of the electrical contact locations from the different levels on the same level. For example the object of the invention is to transfer all contact locations from the lower surface level formed by the monosilicon layer to the upper surface level formed by the polycrystalline layer. By this arrangement subsequent steps in completing fabrication may be carried out as isoplanar processes.

Overall, it is the object of the invention to provide new bipolar modified isoplanar processes for minimizing geometry, reducing dimensions, and enhancing density for very large scale integration.

DISCLOSURE OF THE INVENTION

In order to accomplish these results the present invention provides an improved method for dividing the epitaxial layer of the integrated circuit structure into a plurality of epitaxial islands, pedestals or mesas and for isolating the epitaxial islands relative to each other with isolation oxide regions. The isolation oxide regions are defined by masking and etching the dielectric layers overlying the epitaxial layer to provide the isolation oxide mask. The invention then contemplates time etching the epitaxial layer through the isolation oxide mask and controlling the timing of the etch through the major portion of the epitaxial layer to a level above the interface between the epitaxial layer and substrate. The invention thereby defines epitaxial islands separated by shallow trenches or shallow "V" grooves having surfaces lined with the epitaxial layer semiconductor material for establishing the isolation oxide regions.

According to the invention, the isolation oxide regions are thereafter established in a two step process by first growing a thin thermal isolation oxide layer at elevated temperatures from the semiconductor material of the epitaxial layer lining the surfaces of the shallow trenches. The growth of the thin thermal isolation oxide layer is limited to the interface between the epitaxial layer and substrate thereby limiting the encroachment of thermal isolation oxide into the epitaxial islands. The invention then contemplates filling the shallow trenches or shallow "V" grooves over the thin thermal isolation oxide layer by depositing low temperature isolation oxide in the shallow trenches. The epitaxial islands and isolation oxide regions are planarized according to standard procedures.

Etching of the epitaxial layer is accomplished by an anisotropic unidirectional plasma etch which avoids encroachment into the epitaxial islands. In the preferred embodiment of the invention most of the depth of the epitaxial layer in the isolation oxide regions defined by the isolation oxide mask is removed by etching leaving a thin layer of the semiconductor material from the epitaxial layer in the range for example of approximately 600 to 1,200 Angstrom units. The thickness of the thin thermal isolation oxide layer grown from the epitaxial layer semiconductor material over the surfaces of the shallow trenches is therefore in the range of approximately 1,500 to 3,000 Angstrom units.

This method of the present invention secures the features and advantages of both isoplanar technology and trench technology while avoiding the disadvantages of each. Thus the present invention utilizes a unidirectional anisotropic plasma etch to establish trenches without etching encroachment into the epitaxial islands. However only a shallow trench is formed to a level just above the interface between the epitaxial layer and substrate leaving a thin layer of the epitaxial semiconductor material. Thermal oxide is then grown as provided in isoplanar technology but only from the thin layer lining the shallow trenches producing a thin thermal oxide layer. In isoplanar technology the grown thermal oxide layer fills the isolation oxide region with substantial encroachment into the epitaxial islands. The thin thermal oxide layer of the present invention minimizes and limits encroachment into the epitaxial islands by limiting the isolation oxidation.

The remainder of the isolation oxide region is then formed by depositing low temperature oxide and filling the shallow trenches over the thin thermal oxide layer. A feature and advantage of this preferred form of the invention is that the thin thermal oxide layer is selected in a range sufficiently thin to avoid stressing the corners and surfaces of the trenches avoiding defects which might propagate into the epitaxial islands. On the other hand the thin thermal oxide fill layer has sufficient thickness to prevent any contaminants in the low temperature oxide or other chemical vapor deposition oxide from migrating into the semiconductor material of the epitaxial islands and substrate. According to the invention this preferred thickness of the thermal oxidation layer is in the range of approximately 1,500 to 3,000 Angstrom units. After filling the remainder of the shallow trenches with a deposited low temperature oxide, standard planarization techniques are followed so that the epitaxial islands and two phase isolation oxide regions are substantially isoplanar.

A feature of the present invention intermediate between isoplanar technology and trench technology is that the unidirectional anisotropic etch into the epitaxial layer of the present invention is a shallow etch of less than 1μ into an epitaxial layer approximately 1μ, while in trench technology a deeper etch of for example 4μ is required. In this respect, the trench of the present invention is referred to as a shallow trench or demi-trench. The resulting shallow trench of the present invention results in less active sites along the walls of the trenches. Furthermore the thin thermal oxide layer grown according to the present invention passivates active sites on the walls of the trenches resulting from the unidirectional anisotropic plasma etch.

After collector sink regions of semiconductor material of second conductivity type are implanted in the epitaxial islands, base regions of semiconductor material of first conductivity type are implanted in the epitaxial islands spaced from the collector sink regions. Thereafter a polycrystalline layer of semiconductor material is deposited over the substantially isoplanar epitaxial islands and isolation oxide regions.

According to the enhanced single polysilicon layer process of the invention, the polycrystalline layer is blanket implanted with dopant material forming a uniform polycrystalline resistor layer of semiconductor material across the integrated circuit structure. Typically a uniform N− or P− polysilicon layer is established by the blanket resistor implant across the surface of the integrated circuit structure. A blanket polycrystalline oxide, polysilicon oxide, or polyoxide layer is then grown over the polycrystalline layer. The invention then contemplates defining regions for emitter, collector, and resistor contact locations by masking and etching the polyoxide layer to form an emitter, collector, and resistor contacts implant mask. Definition of these regions for contact locations is followed by implanting through the mask formed by the polyoxide layer into the polycrystalline layer with dopant material forming regions of semiconductor material of low resistance second conductivity type for emitter collector, and resistor contact locations. Typically low resistance N+ polysilicon regions provide the emitter, collector, and resistor contact locations. The polycrystalline layer is then capped with a dielectric barrier layer which may be followed by an emitter anneal step for driving N+ dopant material into the P− base region to form the emitter region.

Thereafter the invention contemplates defining areas of the polycrystalline layer to be retained and to be removed, by masking and etching the dielectric barrier layer thereby forming a poly-definition mask. Exposed portions of the polycrystalline layer are etched away through the poly definition mask leaving resistor regions of high resistance, for example N− polysilicon resistor regions, and emitter, collector, and resistor contact locations of low resistance second conductivity type, for example N+ polysilicon contact locations.

A feature and advantage of the enhanced polysilicon steps according to the present invention is that a masking sequence is eliminated in the preparation of the polycrystalline layer by the blanket resistor implant which avoids an N− or P− masking and etching step. Furthermore, full advantage is taken of the polycrystalline layer during the N+ implanting, masking, and etching steps in utilizing either the low resistance or high resistance characteristics of the polycrystalline layer for integrated circuit elements. For example in addition to emitter, collector, and resistor contact locations of polycrystalline semiconductor material of low resistance second conductivity type, N+ interconnects or runs are also defined providing effectively an additional conductive layer assuming some of the functions of subsequent metal layers. On the other hand the regions of high resistance, typically N− type regions, are used for defining resistors with N+ contact locations at each end of the resistor providing good metal contacts.

The enhanced single layer polysilicon process of the invention also eliminates a subsequent masking, etching and implant sequence for forming semiconductor material of first conductivity type in the polysilicon layer over base regions and ground regions. Conventionally, P type polysilicon regions are implanted in the polysilicon layer for base contact locations and ground substrate contact locations at the surface level of the polysilicon layer. According to the present invention the polysilicon layer is selectively defined and etched to expose the P− ground substrate and base contact locations at the surface level of the monosilicon epitaxial layer and the P type mask, etch and implant sequence in the polysilicon layer is eliminated.

The result of incorporating the polycrystalline or polysilicon layer in the fabrication process for integrated circuit structures according to the invention is that resistor, transistor and circuit elements are formed having contact locations at least at two different surface levels with step locations between the surface levels. According to the present invention contact locations at one surface level are electrically isolated and separated from contact locations at the other surface level while minimizing the spacing requirements. The invention provides the steps of forming an etch stop layer over semiconductor material contact locations on the different surface levels namely the lower surface level of the monosilicon epitaxial layer and the upper surface level of the polysilicon layer, and depositing a blanket conformal spacer layer of dielectric material of substantially uniform thickness over the integrated circuit structure including the different surface levels and step locations between the levels.

The spacer layer is then anisotropically etched in the direction orthogonal to the surface levels of the integrated circuit structure using a blanket unidirectional anisotropic plasma etch. The spacer layer is etched to the etch stop layer over the semiconductor material contact locations on the different surface levels, leaving spacer shoulders of dielectric material from the spacer layer at the step locations between levels. A feature and advantage of this arrangement is that the contact locations on different surface levels adjacent to the step locations are dielectrically isolated and separated with minimum spacing between the contact locations. The maskless anisotropic etch of the present invention avoids the greater spacing requirements of a mask etch and the registration problems of photolithography thereby reducing transistor size.

Typically the blanket spacer layer comprises a nitride layer formed by plasma enhanced chemical vapor deposition while the etch stop layer is an etch stop oxide layer. Alternatively the blanket spacer layer may comprise low temperature oxide with an etch stop layer of different material such as for example an etch stop nitride layer. Typically the lower surface level is a monosilicon layer namely the monosilicon epitaxial layer while the upper surface level is provided by the polysilicon layer. The spacer shoulders isolate and separate base contact locations on the lower surface level monosilicon layer, typically P− silicon regions, from emitter contact locations on the upper surface level polysilicon layer, typically N+ silicon regions. Ground contact locations on the lower surface level monosilicon layer may be isolated for example from resistor contact locations on the upper surface level polysilicon layer.

After establishing the spacer shoulders according to the invention good metal contacts surfaces may be established at the contact locations by forming a low resistance silicide layer over the semiconductor material of the contact locations. To this end the invention provides the steps of removing the etch stop layer thereby exposing the contact locations at the different levels and sputtering or otherwise depositing a layer of refractory metal reactive with the semiconductor material over the different surface levels. The layer of refractory metal is then sintered and reacted with the semiconductor material forming a low resistance silicide layer over the contact locations on the different levels. The refractory metal remains unreacted over the dielectric surfaces and is stripped from the spacer shoulders between contact locations to be isolated and separated thereby leaving isolated and separated low resistance contact locations with minimum spacing requirements. In the preferred embodiment the reactive and refractory metal is titanium sputtered over all of the surfaces of the integrated circuit structure.

The invention also provides a new method for resolving the problems presented by electrical contact locations at different levels of an integrated circuit structure. Thus, in the enhanced polycrystalline layer process or single polysilicon layer process for fabricating bipolar modified isoplanar integrated circuits according to the invention, transistor element contact locations and in particular the base contact locations, typically P or P− type silicon are formed and exposed on the monosilicon epitaxial layer. The monosilicon layer forms a lower surface level in the integrated circuit structure. On the other hand the emitter, collector sink, and resistor contact locations, typically N+ type silicon are formed in the polycrystalline layer or polysilicon layer overlying the monosilicon epitaxial layer. The polycrystalline layer forms a second upper surface level of the integrated circuit structure. Step locations between the lower and upper surface levels separate contact locations on the two levels. This departure from a thorough going isoplanar process requires masking, etching and depositing metal contacts at two different levels in finishing the integrated circuit structure.

According to the present invention the departure from isoplanar arrangements of the electrical contacts may be resolved by forming polycrystalline contact islands during fabrication of the integrated circuit structure adjacent to contact locations on the lower surface level of the monosilicon layer. The polycrystalline or polysilicon contact islands provide transfer contact locations at the upper surface level for electrical transfer from contact locations on the lower surface level. The contact locations on the lower and upper surface levels are exposed and a layer of refractory metal reactive with the silicon is formed over the lower and upper surface levels for example by sputtering. The invention provides the steps of sintering or reacting the layer of refractory metal with the monosilicon and polysilicon at the contact locations forming a low resistance silicide layer over the contact locations on the lower and upper surface levels.

The layer of refractory metal is selectively masked and etched from the surface levels removing unreacted refractory metal between contact locations to be isolated and separated while leaving conductive metal strips or bridges between the silicide layers over contact locations on the lower surface level and transfer contact locations on the upper surface level provided by adjacent polysilicon islands. Alternatively, the sputtered or deposited metal layer is selectively masked and stripped prior to sintering or reacting to leave the desired pattern. A feature and advantage of this "briding" arrangement is that all of the contact locations for elements of the integrated circuit structure are constituted on the same upper surface level of the polycrystalline layer substantially restoring an isoplanar arrangement of contact locations for subsequent processing according to isoplanar methods.

In order to accomplish this result the step of defining the areas of the polycrystalline layer to be retained and to be removed includes defining polycrystalline or polysilicon islands to be retained for transfer contact locations. Advantageously the polycrystalline or polysilicon islands are constructed and arranged adjacent to contact locations of the lower surface level on the monosilicon epitaxial layer. Thus the polycrystalline islands are included in the poly-definition mask. The step of etching away exposed portions of the polycrystalline or polysilicon layer leaves the polycrystalline islands for electrically transferring contact locations from the lower surface level epitaxial layer to the upper surface level polycrystalline layer. Typically, the transfer contact locations of the polysilicon islands are of semiconductor material of low resistance second conductivity type, for example N+ type polysilicon. The transfer contact locations on the polysilicon islands are N+ implanted during the previous emitter, collector sink, and resistor contacts N+ implant sequence in the polysilicon layer.

The method according to the present invention of developing spacer shoulders of dielectric material at the step locations between surface levels particularly lends itself to the new method for transferring and constituting all of the contact locations to the upper surface level polycrystalline layer. While the dielectric material spacer shoulders isolate and separate contact locations on the two surface levels adjacent to the step locations, the spacer shoulders also provide dielectric surfaces for unreacted refractory metal deposited over the upper and lower surface levels. Multiple use of the dielectric material spacer shoulders may be implemented after sintering and reacting the layer of refractory metal with the exposed semiconductor material at contact locations.

Thereafter the invention contemplates selectively masking and etching or stripping the refractory metal layer removing unreacted refractory metal from spacer shoulders between contact locations to be isolated and separated. On the other hand the selective masking and etching of the titanium layer or other refractory metal layer is constructed and arranged to leave conductive metal strips or bridges over spacer shoulders at the polysilicon islands adjacent to contact locations on the lower surface level. Thus, conductive metal strips or bridges are left over the polysilicon island shoulders of dielectric material between contact locations on the lower surface level of the monosilicon layer and transfer contact locations on the upper surface level of the polysilicon islands.

In the absence of the spacer shoulders of dielectric material, the sputtered or deposited refractory metal layer must be selectively masked and etched to leave the desired pattern prior to sintering or reacting the metal. A feature and advantage of the dielectric spacer shoulders is that the metal remains unreacted over the dielectric surface of the spacer shoulders during sintering.

In summary, the present invention provides an improved and enhanced process for fabricating modified isoplanar integrated circuits incorporating a number of interactive and co-acting process steps to minimize geometry, reduce dimensions, and enhance density for very large scale integration. First the invention establishes the oxide isolation of epitaxial islands in a two step process, forming a thin thermally grown oxide layer over the surfaces of limited shallow trenches or shallow "V" grooves and then filling the shallow trenches with deposited low temperature oxide. Second the invention enhances use of the single polycrystalline or polysilicon layer using a blanket implant, eliminates masking and etching steps, and defines the polycrystalline layer for greater and more efficient use for resistor, transistor, interconnect, and related circuit elements of the integrated circuit structure.

Third the invention provides a new method and structure for dielectrically isolating and separating contact locations of elements of the integrated circuit structure and in particular for separating and isolating contact locations on different surface levels of the integrated circuit structure adjacent to step locations between the surface levels. Spacer shoulders of dielectric material are formed at the step locations separating contact locations on the lower surface level of the monosilicon epitaxial layer from contact locations on the upper surface level of the polycrystalline or polysilicon layer using a blanket layer and an anisotropic etch.

Finally the invention provides a new method for constituting all of the electrical contact locations for the elements of the integrated circuit structure at the same substantially isoplanar level. This is accomplished by bridging from contact locations on the lower surface level of the monosilicon epitaxial layer to transfer contact locations on the polysilicon layer. Polycrystalline islands providing the transfer contact locations are included in the definition of the polycrystalline layer and the spacer shoulders at step locations of the polycrystalline islands provide sites for leaving the bridges or strips of titanium or other refractory metal between the contact locations at the lower surface level and the transfer contact locations on the upper surface levels of the poly islands. The refractory metal layer introduced for silicidation therefore assumes functions of later metal layers according to the present invention.

Other objects, features and advantages of the invention are apparent in the following specification and accompanying drawings.

BRIEF DESCRIPTION OF THE DRAWINGS

FIG. 1 is a fragmentary diagrammatic cross-section of a portion of an integrated circuit structure showing epitaxial islands or mesas separated by shallow trenches according to the invention. The etched sloping boundaries of the shallow trenches or shallow "V" grooves follow the 54° inclined plane of the silicon crystal. In subsequent figures this etched boundary between the isolation oxide and active epitaxial layer elements is shown diagrammatically as vertical for simplicity and clarity of the drawings.

FIG. 2 is a fragmentary diagrammatic cross-section of the same portion of the integrated circuit structure showing isolation oxide regions formed according to the two step oxide isolation process of the invention. The isolation oxide is shown in two parts, the thin layer of thermally grown isolation oxide and overlying deposited low temperature oxide. Isolation oxide/epitaxial layer boundaries are shown to be vertical for simplicity.

FIG. 3 is a composite fragmentary diagrammatic cross-section of the same portion of the integrated circuit structure showing the N+ implant of the collector sink region and P− implant of the base region and ground contact region. In this and subsequent drawings, the thermal isolation oxide thin layer and deposited low temperature oxide are shown for simplicity as the single merged isolation oxide region.

FIG. 4 is a fragmentary diagrammatic cross-section of the same portion of the integrated circuit structure showing the deposition of the polysilicon layer, blanket N− implant of the polysilicon layer and polyoxide layer according to the invention.

FIG. 5 is a fragmentary diagrammatic cross-section of the same portion of the integrated circuit structure showing the N+ implant mask and N+ implant into the polysilicon layer.

FIG. 6 is a composite fragmentary diagrammatic side cross-section of the same portion of the integrated circuit structure showing the etched polysilicon layer and the overlying spacer layer of dielectric material according to the present invention.

FIG. 7 is a fragmentary diagrammatic cross-section of the same portion of the integrated circuit structure showing the dielectric spacer dielectric shoulders resulting from the anisotropic etch.

FIG. 8 is a fragmentary diagrammatic cross section of the same portion of the integrated circuit structure showing the silicidation of exposed contact locations and the conducting bridges or transfer strips formed over the spacer shoulders between contact locations on the two different levels according to the invention.

FIG. 9 is a fragmentary diagrammatic cross-section of the same portion of the integrated circuit structure showing a metal contact mask in place over the integrated circuit structure with all contact locations at the same upper levels, while

FIG. 10 is a fragmentary diagrammatic plan view of the layout of integrated circuit elements showing the polysilicon island according to the invention with a refractory metal strip or bridge over the polysilicon island spacer shoulder for transferring the contact location from the lower surface level monosilicon base contact to the upper surface level polysilicon island, while

Figure 9A:
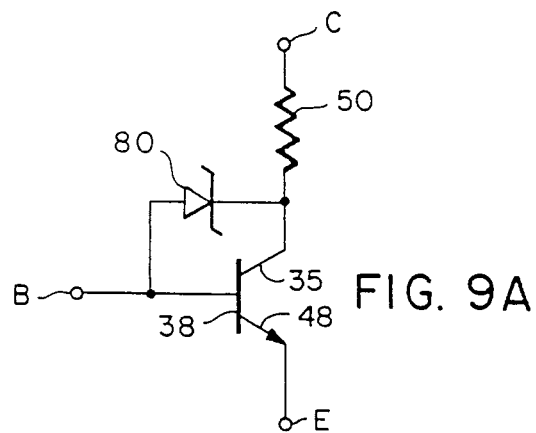
FIG. 9A is a schematic equivalent circuit diagram of the structure of FIG. 9.

DETAILED DESCRIPTION OF PREFERRED EXAMPLE EMBODIMENTS AND BEST MODE OF THE INVENTION

The steps in fabricating a new bipolar modified isoplanar integrated circuit structure according to the invention are illustrated in FIGS. 1-9. FIG. 1 shows in diagrammatic cross section a fragmentary portion of a substrate 10 of, for example, P type silicon semiconductor material. The N+ silicon buried collector layer or subcollector layer 12 is formed in the conventional manner by mask, etch, and implant steps. Thus, an initial oxide layer is grown uniformly across the substrate 10, a photoresist material is spun on the oxide layer, the photoresist is exposed through a light mask with openings defining the buried collector regions, and the exposed portions of the photoresist layer are washed away with developer leaving the photoresist material as an etching mask. The underlying oxide layer is etched to expose the substrate 10 at the surface locations of buried collector layer regions 12 and N type impurities such as arsenic or phosphorous are introduced into the buried collector layer regions by ion field implant methods or diffusion, followed by anneal, to an N+ concentration which affords low resistance or high conductivity semiconductor material in the buried collector layer regions 12.

The channel stop regions 14, 15, and 16 are similarly formed in the substrate 10 by conventional mask, etch, and implant steps. P type impurities such as boron are introduced into the channel stop regions by implant or diffusion to P+ concentration levels for low resistance or high conductivity. The channel stop regions 14, 15, and 16 assure the reliability of the integrated circuit structure by substantially eliminating the problem of parasitic MOS FET transistor effects between adjacent epitaxial islands.

The initial oxide layer is stripped and epitaxial layer 18 is then deposited or precipitated onto the substrate 10 in the form of a single crystal layer by, for example, an epitaxial chemical vapor deposition process. The epitaxial silicon is lightly doped with arsenic so that the epitaxial layer is formed with N— concentration for high resistance or low conductivity. The surface of epitaxial layer 18 is oxidized to form a thin epitaxial oxide layer or epioxide layer 20 of silicon dioxide ($SiO_2$). Epitaxial oxide layer 18 forms an isoplanar oxide layer and provides stress relief for the nitride layer or cap 22. The nitride layer 22 is deposited over the epitaxial oxide buffer layer 20 by, for example, chemical vapor deposition. The silicon nitride layer 22 is of the chemical form $Si_xN_yO_z$ comprising, for example, $Si_3N_4$.

According to the invention epitaxial islands 25 are formed by defining isolation oxide regions 30 between the epitaxial islands using the dielectric layers 20 and 22 as the isolation oxide mask. This is accomplished by photomasking and etching the nitride layer 22 and epioxide layer 20 in the pattern of the isolation oxide regions.

In contrast to the conventional etching of the silicon epitaxial layer 18 at the locations of the isolation oxide regions 30, the present invention uses a timed anisotropic plasma etch through the major portion of the epitaxial layer 18. By timing control the etch through the major portion of epitaxial layer 18 is limited to a level above the interface 26 between the epitaxial layer 18 and substrate 10 leaving a thin layer 27 of epitaxial semiconductor material at the base of a shallow groove in the epitaxial layer 18.

As shown in FIG. 1, the timed or time controlled plasma etch produces a shallow trench in the vicinity of the isolation oxide regions 30 terminating just above the interface 26. The silicon is preferably etched along the crystal planes resulting in shallow trenches or grooves with sloping walls 28 along, for example, the 54° crystal axis of the epitaxial silicon. The epitaxial layer 18, typically 1 micron ($\mu$) in thickness, is etched for example to a depth of 9,000 angstrom units (Å) leaving a thin epitaxial layer 27 of for example 1,000 Å lining the base of the shallow groove or trench.

As shown in FIG. 2, the isolation oxide regions 30 are filled with oxide according to the invention in a two-step process by first growing a thin thermal isolation oxide layer 32 at elevated temperatures from the thin layer 27 of epitaxial semiconductor material lining the surfaces of the shallow trenches or grooves shown in FIG. 1. The thin thermal oxide layer grown in the etched grooves or trenches of the isolation oxide regions 30 is in contrast to conventional isolation oxide procedures in which a substantial portion of the epitaxial islands are consumed in the thermal oxide of the isolation oxide regions. In conventional isolation oxide processes, approximately half of the epitaxial layer 18 may be consumed in growing thermal isolation oxide. According to the present invention, only a thin layer of epitaxial silicon in the order of, for example, 1,000 Å or 0.1$\mu$ is consumed with only very limited encroachment into the walls of the epitaxial islands.

The thin thermal oxide layer 32 is typically grown in a furnace at, for example, 960°–1,000° C. in dry oxygen for a reaction time of approximately an hour or in steam for approximately a half hour. Growth of the thin thermal oxide layer 32 may also be accelerated in a pressure vessel at, for example, 25 atmospheres of steam for a reaction time of approximately ten minutes at 950° C.

The preferred thickness of the thin thermal oxide layer 32 lining the isolation oxide regions 30 is in the range of approximately 1,500 Å–3,000 Å. At the thinner end of the range a thermal oxide layer of 1,500 Å is sufficient to prevent any substantial amounts of impurities from passing through the thin thermal oxide layer 32 into the epitaxial layer. At thicknesses greater than 3,000 Å there is substantial encroachment into the epitaxial islands and stresses are produced at corners and defects in the epitaxial layer along the surface of the shallow trench or groove. In order to achieve the preferred range of thickness for the thin thermal oxide layer 32 of 1,500 Å–3,000 Å, the anisotropic plasma etch through the epitaxial layer is timed to leave a thin layer 27 of epitaxial silicon lining the trench or groove in the range of 600 Å–1,200 Å. The oxide growth ratio of silicon to silicon dioxide ($Si/SiO_2$) is approximately 1/2.5 thereby establishing the preferred range for the thin epitaxial layer 27.

In the second step of the isolation oxide process the shallow trenches or shallow V grooves lined with the thin thermal oxide layer 32 are filled by depositing low temperature isolation oxide 34 in the shallow trenches. Filling of the isolation oxide regions 30 over the thin thermal oxide layer 32 may be accomplished by either a low temperature oxide (LTO) deposit, a plasma enhanced chemical vapor deposition (PECVD), a low pressure chemical vapor deposition (LPCVD), etc. The low temperature or vapor deposition of silicon dioxide fills the isolation oxide regions 30 without the stresses associated with growing high temperature thermal oxide and without the encroachment into epitaxial islands. The present invention is therefore suitable, for example, for large-scale integration with enhanced density and epitaxial islands 6μ in width and even 3μ–6μ in width. Encroachment of thermal oxide into the sides of the LSI epitaxial islands is therefore limited to acceptable levels. Upon completion of the two-step isolation oxide process, according to the invention, the epitaxial islands and isolation oxide regions are planarized according to standard procedures.

In forming the shallow trenches or grooves in preparation for establishing the isolation oxide regions, the epitaxial silicon is preferably etched along the crystal planes, for example the 54° crystal planes or axes. Etching across the crystal planes or axes leaves an electrically active layer of active bonds lining the trench or groove. Such active sites may cause defects in the epitaxial crystal layer which propagate into the epitaxial islands during growth of the thermal oxide. The active sites along the walls or sides of the epitaxial islands may also produce dead regions in the epitaxial islands. According to the present invention these difficulties are avoided by preferentially etching along the crystal planes or axes. The thin thermal oxide layer may also help to passivate any active sites on the walls of the V trenches or grooves.

While the slooping sides or walls 28 of the shallow grooves or V trenches are shown in the diagrammatic view of FIG. 1, the walls or sides of the isolation oxide regions 30 are simplified and shown diagrammatically as vertical sides or walls in the subsequent FIGS. 2 through 9. This simplification or diagrammatic presentation is intended only for clarity of the illustrations keeping in mind the preferred plasma etch orientation along the crystal planes or axes in establishing the isolation oxide regions.

Furthermore as shown in FIG. 2 the isolation oxide region is comprised of two structural elements established in a two step process namely the thin thermal oxide layer 32 grown from the thin layer 27 of epitaxial silicon and the filler of deposited oxide 34 for example LTO or PECVD. In the subsequent FIGS. 3 through 9 however the isolation oxide region 30 is simplified and shown diagrammatically as a merged structure. In FIGS. 3 through 9 therefore the isolation oxide regions are designated by the single reference numeral 30.

As shown in FIG. 2, during the growth of the thin thermal oxide layer 32 at high temperatures there is some up diffusion of the P+ region 14 and the N+ buried collector layer region 12 into the remaining semiconductor material of the epitaxial layer 18. The P+ region 14 may be used for example to provide a ground contact location or ground substrate tap as hereafter described. On the other hand the P+ channel stop regions 15 and 16 encounter the thin thermal oxide layer 32. As a result the thin thermal oxide layer 32 and P+ channel stop regions 15 and 16 meet substantially at the interface between the epitaxial layer 18 and substrate 10. During thermal growth of the thin oxide layer 32 the boron in the P+ channel stop region 14 updiffuses so that the ground substrate taps become more conductive. Updiffusion from the buried collector layer 12 into the active region of epitaxial island 25 is limited to acceptable levels.

Upon planarization of the epitaxial islands and isolation oxide regions using standard planarization methods such as plasma etch back of a photoresist layer, spaced apart collector sink regions and base regions are implanted in the active epitaxial islands 25. The collector sink contact 35 is formed by an N+ implant, for example of arsenic ions, through the collector sink mask 36, using standard mask, etch and implant steps followed by an anneal step to drive the N+ dopant material of the collector sink contact 35 into the buried collector layer 12. As a result the collector of a transistor to be formed on epitaxial island 25 includes of continuous low resistance or high conductivity semiconductor material. During the anneal step a thin oxide layer or screen oxidation layer may be grown over the exposed epitaxial layer silicon.

The base region 38 is formed by a P− implant through the base mask 40 using a standard photoresist mask, etch and implant sequence. The base region 38 is implanted through the thin oxide layer. At the same time the base mask 40 is formed with openings for implanting the ground substrate taps or contacts 42 with a P− implant. Thus, the base mask 40 provides a P− concentration implant of boron wherever contacts to the substrate are to be made, in addition to base regions for transistors on active epitaxial islands 25. During the sink implant, anneal, and base implant steps, boron in the P+ channel stop region 14 diffuses upward in the ground contact or substrate tap region. The P+ up diffusion compensates for the high resistance N− epitaxial silicon and merges with the P− implant to form a ground contact region P+ to P low resistivity silicon shown as the continuous region between the P+ channel stop region 14 and the merged P ground tap or contact 42.

Following implant of the collector sink, base and ground taps, a single polycrystalline or polysilicon layer 45 is formed over the integrated circuit structure of epitaxial islands and isolation oxide regions. The polysilicon is deposited at a temperature in the range of for example 600° C. forming small crystals randomly oriented. The polycrystalline, polysilicon or poly layer 45 is deposited to a depth of approximately $\frac{1}{2}$μ or 4,000–5,000 Å units. According to the invention the polysilicon layer 45 is then implanted with a blanket N− implant forming an N− polylayer and eliminating a subsequent masking step. A blanket thermal oxide layer is then grown over the polysilicon layer 45 forming the protective polyoxide layer 46.

The blanket N− implant of the polysilicon layer 45 results in a high resistance layer to be used in subsequent resistor components or elements of the integrated circuit structure as hereafter described. The blanket N− implant is therefore also referred to as a resistor implant. Furthermore the blanket implant of the polysilicon layer 45 may alternatively be a P− implant, also providing a blanket high resistance or resistor implant for use subsequently in resistor components and elements.

For some applications of the blanket implant, which according to the invention avoids a conventional masking step the P− resistor implant is actually preferable to the N− implant. The blanket resistor implant of polysilicon layer 45 is intended to provide a sheet resistance in the range of for example 750 ohms per square to 1,200 ohms per square. The subsequent polyoxide layer 46 is grown to a thickness sufficient to protect the resistor regions from later processing, a thickness in the range of for example 1,500–2,500 Å units and typically 2,000 Å units.

An N+ mask, etch and implant sequence forms low resistance high conductivity N+ regions in the polysilicon layer 45 for defining collector contacts, emitter contacts, resistor contacts and low resistance interconnects or runs between contacts on the upper surface level polysilicon layer. The results of the N+ photoresist mask, oxide etch and N+ implant sequence is shown in FIG. 5. Following the N+ implant sequence a thermal oxide layer or cap 46 is grown over the polysilicon layer 45 followed by an anneal step. While the N+ cap or dielectric layer 46 is typically an oxide grown over the polysilicon layer 45, a deposited oxide or nitride layer may also be used. After the polycrystalline layer is capped with a dielectric barrier layer, an emitter anneal step may be used for driving N+ dopant material into the P− base region 38 to form the N+ emitter region 48.

Portions of the polysilicon layer 45 to be retained and to be removed by masking and etching are defined by a polydefinition mask using the dielectric barrier layer or cap 46. By means of a mask and etch sequence the oxide layer 46 or other dielectric cap is etched over areas where the polycrystalline silicon material is to be removed. The patterned and etched oxide cap or other dielectric layer 46 provides the polydefinition mask and exposed portions of the polycrystalline layer are etched away. The portions of polysilicon layer 45 retained include the N− high resistance resistor region 50, N+ low resistance resistor contacts 52 and 54, N+ low resistance collector contact 56, low resistance interconnect 55 interconnecting the resistor contect 54 and collector contact 56, N+ low resistance emitter contact 58, and N+ low resistance polycrystalline islands 60 and 62. As hereafter described, the polycrystalline islands 60 and 62 provide N+ low resistance transfer contact locations on the upper level polycrystalline layer for transfer of the contacts for the base region 38 and ground substrate 14 to the upper surface level.

The polydefinition mask and etch sequence exposes on the lower surface level of the epitaxial layer 18 contact locations for the base region 38 of the transistor in active epitaxial island 25 and a ground contact for the ground substrate tap 14. Thus as shown in FIG. 6 the exposed contacts for the ground substrate tap 14 and base region 38 are on the lower surface level monosilicon epitaxial layer 18 while the collector, emitter, resistor and interconnect contacts are on the upper surface level polycrystalline layer 45. Furthermore, the polycrystalline islands 60 and 62 and the transfer contact locations provided by the poly islands 60 and 62 are also on the upper surface level. The polydefinition mask and etch sequence further establishes step locations between contact sites or locations on the two levels all as shown in FIG. 6. The polycrystalline islands 60 and 62 and the upper surface level transfer contact locations of polycrystalline islands 60 and 62 are strategically defined and positioned adjacent to the lower surface level contact sites or contact locations for the base region 38 and ground substrate tap 14 for subsequent transfer of these contact locations from the lower surface level to the upper surface level over the intermediate and adjacent step locations all as hereafter described.

Following the polydefinition etch, the oxide cap or layer 46 is supplemented with oxide layers 64 providing an etch stop layer over all of the exposed silicon. The etch stop oxide layers 46 and 64 are selected to be of different material from the blanket conformal spacer layer 65. This spacer layer 65 is then deposited with substantially uniform thickness over the entire integrated circuit structure including the different surface levels of the monosilicon epitaxial layer 18, the polycrystalline layer 45, and the step locations between the levels.

The blanket conformal spacer layer 65 is typically a nitride layer deposited for example by plasma enhanced chemical vapor deposition while the etch stop layer 46 and 64 is an oxide layer. Alternatively, the blanket spacer layer 65 may comprise low temperature oxide deposited over the integrated circuit structure with an etch stop layer 46, 64 of different material such as for example an etch stop nitride layer. In the preferred example of an etch stop oxide layer 46, 64 and a PECVD blanket spacer layer, the etch stop oxide layer 46, 64 may be a thin layer of low temperature oxide or a light thermal oxide layer. A light thermal oxide layer covers all the exposed polysilicon and monosilicon areas, both contact areas on the top and side walls. The light thermal oxide layer is grown to a thickness of for example 750 Å units over the exposed monosilicon layer contacts forming the etch stop layer 64 while the previously formed oxide cap or layer 46 is enhanced also forming an etch stop oxide layer.

The blanket PECVD nitride layer 65 having a spacer layer thickness of for example 4,000–5,000 Å units is then etched using an anisotropic unidirectional plasma etch in the downward direction to the etch stop oxide layer 46, 64 and the isolation oxide regions 30. The maskless unidirectional etch leaves portions of the dielectric blanket spacer layer 65 in the configuration of shoulders 66 at the step locations between the retained portions of the polysilicon layer 45 and the epitaxial monosilicon layer 18. As a result the adjacent contact locations on the polysilicon upper level and monosilicon lower level are dielectrically isolated and separated with minimum spacing between the contact locations.

The width of the shoulders 66 is typically for example 4,000–5,000 Å units. The width of the shoulders 66 may be controlled by the thickness of the spacer layer 65 affording a wide range of available spacings for example for the base to emitter spacing of the emitter contact 58 and the contact to the base region 38.

The etch stop layer 46, 64 is removed in an etch stop dip leaving the exposed monosilicon and polysilicon contacts on the lower level epitaxial monosilicon layer 18 and upper level polysilicon layer 45 as shown in FIG. 7. The bare or exposed dielectric nitride shoulders 66 separate and isolate the exposed contacts at the two levels and avoid the much greater spacing requirements and registration problems of marking and photolithography. The transistor size and base resistance are reduced enhancing the density of the integrated circuit structure.

A feature and advantage of the present invention and process over conventional advanced single polysilicon layer emitter couple technology is that not all contacts must be made through the polysilicon layer 45. As a result the number of mask, etch, and implant sequences is reduced. According to the standard advanced single poly emitter contact technology, no electrical contact locations are allowed at the lower level epitaxial monosilicon layer and all contacts must be made through the polysilicon layer to the first metal layer. According to the present invention the contacts for elements or components of the integrated circuit structure are exposed at both the upper level polysilicon layer 45 and the lower level epitaxial monosilicon layer 18 separated by the dielectric spacer shoulders 66 of the present invention. As hereafter described, the shoulders 66 afford a new method and arrangement for constituting all electrical contact locations at the upper level or polysilicon layer.

A refractory metal such as titanium is then applied by sputtering over the entire surface of the integrated circuit structure including the exposed poly contacts on the upper surface level polysilicon layer and the exposed monosilicon contacts on the lower level epitaxial layer 18. The titanium or other refractory metal then reacts with the exposed silicon both the polysilicon and monosilicon, in a rapid thermal anneal based sintering process. The sintering reaction is accomplished in a small chamber for example with a focused heat source which heats the wafer to approximately a thousand degrees in seconds for a short reaction time. The titanium sinters or reacts with the silicon to form a silicide ($TiSi_2$) conductive layer over the contact locations as shown in FIG. 8.

For further processing with contact locations at the two separate levels the unreacted titanium over the dielectric surfaces is stripped leaving the isolated and separated low resistance contact locations with minimum spacing requirements. As shown in FIG. 8, the contact locations include the resistor contact locations 52 and 54, the collector contact location 56 and the interconnect 55 electrically coupling the resistor contact 54 and collector contact 56. The upper level contact locations also include the emitter contact location 58. The lower contact locations include the base contact location 68 and the ground contact location 70. All of the contact locations are covered with the low resistance silicide layer designated in FIG. 8 by the heavier lines $TiSi_2$.

According to the present invention however all contact locations are constituted on the upper surface level for further processing. Unlike the conventional advanced single poly layer emitter coupled technology, electrical contact to the lower surface level monosilicon layer 18 is not made through the polysilicon layer 45. Rather all electrical contacts are constituted on the upper surface level by the novel process and structure illustrated in FIGS. 8 and 9. According to the invention polysilicon islands 60 and 62 are retained from the polysilicon layer 45 as heretofor described and the layer of titanium or other refractory metal is sintered on the upper surface to provide transfer contact locations 72 and 74 adjacent to the lower surface level base contact location 68 and ground contact location 70. In further accordance with the invention the remaining unreacted titanium is selectively masked and stripped from the surfaces of the integrated circuit structure removing unreacted refractory metal between contact locations to be isolated and separated such as the emitter contact location 58 and the base contact location 68. On the other hand the refractory metal such as titanium is retained by the mask between contact locations on the lower surface level and transfer contact locations on the upper surface level provided by adjacent polysilicon islands.

Thus referring to FIG. 8, an unreacted refractory metal strip or bridge such as titanium strip or bridge 75 is retained over the spacer shoulder 66 between the base contact location 68 on the lower surface level epitaxial monosilicon layer 18 and the transfer contact location 72 on polysilicon island 60 of the upper level polysilicon layer 45. Reference is also made to FIGS. 10 and 10A for a detailed plan view and side cross section of this fragmentary portion of FIG. 8. Similarly an unreacted refractory metal strip or bridge and in particular titanium strip or bridge 76 is retained on shoulder 66 at the step location between ground contact 70 on the lower level monosilicon epitaxial layer 18 and the transfer contact location 74 on polysilicon island 62 of the upper level polycrystalline layer 45. As a result, all silicon contact locations of the integrated circuit structure are transferred or constituted on the upper surface or upper level polycrystalline silicon layer 45 for subsequent processing according to isoplanar methods. The titanium strips 75 and 76 are designated in FIGS. 8 and 9 by the intermediate weight lines Ti.

According to the invention a bridge mask or refractory metal mask is used to retain conductive metal strips or bridges over the spacer shoulders 66 at step locations between monosilicon contact locations and polysilicon transfer contact locations bringing all contacts up to the same level for final metal contact masking. The titanium bridges, straps or strips are only required for transfer from lower surface level monosilicon contacts to adjacent transfer contact locations on the polycrystalline islands. Once the electrical contacts are transferred or constituted on the poly level, the silicide layer over the polycrystalline interconnects may be used for conductors between elements or components of the upper level polycrystalline layer. Thus poly interconnects are previously laid out and retained during the poly definition mask such as for example the poly interconnect 55 interconnecting the resistor contact 54 of collector resistor 50 with the collector contact 56 of transistor collector 35, part of the active epitaxial island 25 and epitaxial layer 18. As shown in FIG. 10, the titanium runs or bridges 75 are relatively short and wide within the space constraints and depending upon the current to the carried to minimize resistance. Other refractory metals may also be used for the conductive bridges, strips or straps such as molybdenum or tungsten.

Figure 10:
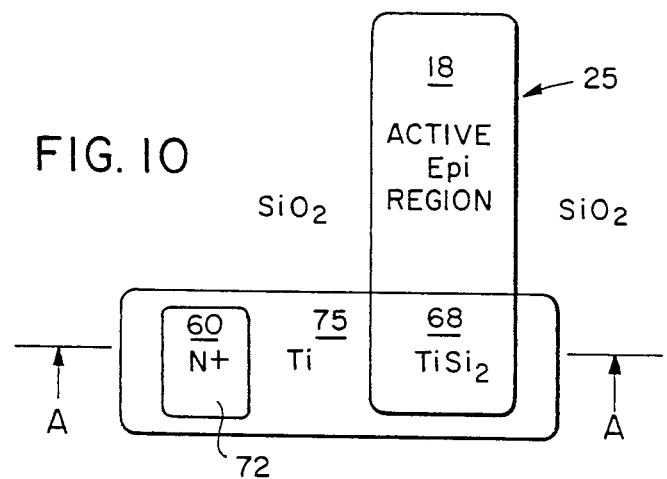
Figure 10A:
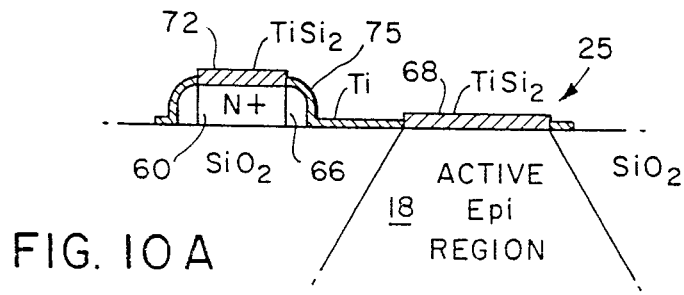
FIG. 10A is a diagrammatic cross-section of the same structure in the direction of the arrows on line A—A of FIG. 10.

Finally a planarized dielectric layer 80 is formed over the entire integrated circuit structure followed by a mask and etch for electrical contacts to be made at the collector C, emitter E, base B, and ground GND connections as shown in FIG. 9. An equivalent circuit of this portion of the final integrated circuit structure of FIG. 9 is illustrated in FIG. 9A with corresponding elements designated by the same reference numerals and letters. The Schottky diode 82 between the base region 38 and collector region 35 results from the intermediate N− silicon region 82 as shown in FIG. 9. The ground contact substrate tap of FIG. 9 separate from the active epitaxial island 26 is not shown in the equivalent circuit diagram of FIG. 9A.

While the invention has been described with reference with particular example embodiments it is intended to cover all variations and equivalence within the scope of the following claims.

We claim:

1. An enhanced density single polycrystalline layer semiconductor process for fabricating a bipolar modified isoplanar integrated circuit structure having a substrate of semiconductor material of first conductivity type, an epitaxial layer of semiconductor material of second conductivity type deposited over the substrate, said epitaxial layer being subdivided into a plurality of epitaxial islands, pedestals, or mesas, with isolation oxide regions surrounding and isolating the epitaxial islands, said isolation oxide regions being substantially coplanar with the epitaxial islands, base regions of semiconductor material of first conductivity type formed in the epitaxial islands spaced from the collector sink regions, and a polycrystalline layer of semiconductor material deposited over the substantially isoplanar epitaxial islands and isolation oxide regions, the method for defining and completing transistor and resistor elements in the integrated circuit structure comprising:

blanket implanting the polycrystalline layer with dopant material forming polycrystalline layer of semiconductor material of high resistance across the integrated circuit structure;

growing a blanket polyoxide layer over the polycrystalline layer;

defining emitter, collector, and resistor contact locations by masking and etching the polyoxide layer thereby forming an emitter, collector, and resistor contacts implant mask;

implanting through the emitter, collector, and resistor contacts mask formed by the polyoxide layer into the polycrystalline layer with dopant material forming emitter, collector, and resistor contact locations of semiconductor material of low resistance in the polycrystalline layer;

capping the polycrystalline layer with a dielectric barrier layer;

defining areas of the polycrystalline layer to be retained and to be removed, by masking and etching the dielectric barrier layer thereby forming a poly-definition mask;

etching away exposed portions of the polycrystalline layer through the poly-definition mask leaving polycrystalline layer resistor regions of high resistance and polycrystalline layer emitter, collector, and resistor contact locations of low resistance while exposing base region contact locations and ground contact locations on the epitaxial layer, said epitaxial layer forming a first or lower surface level of electrical contact locations including base region contact locations and ground contact locations, said polycrystalline layer forming a second or upper surface level of electrical contact locations including the emitter, collector, and resistor region contact locations, with step locations between the lower and upper surface levels;

forming an etch stop layer over exposed contact locations on the lower and upper surface levels;

depositing a blanket conformal spacer layer of dielectrical material of substantially uniform thickness over the integrated circuit structure including the lower and upper surface levels and the step locations between the levels; and anisotropically etching the spacer layer in the direction orthogonal to the surface levels of the integrated circuit structure using a blanket unidirectional anisotropic etch, etching to the etch stop layer over the contact locations on the lower and upper surface levels, and leaving spacer shoulders of dielectric material from the spacer layer at the step locations between surface levels thereby dielectrically isolating and separating contact locations on the two surface levels adjacent to the step locations.

2. The process of claim 1 further comprising the step of annealing after implanting through the emitter, collector, and resistor contacts implant mask and after capping the polycrystalline layer with a dielectric barrier layer thereby driving dopant material and forming emitter regions in the base regions of the epitaxial islands.

3. The process of claim 1 wherein the step of forming an emitter, collector, and resistor contacts implant mask includes defining interconnects for interconnecting elements with runs of low resistance semiconductor material; wherein the step of implanting through the implant mask includes forming interconnect regions of polycrystalline semiconductor material of low resistance; and wherein the steps of forming the poly-definition mask and etching away portions of the polycrystalline layer leave low resistance polycrystalline semiconductor material interconnects in the polycrystalline layer.

4. A method for fabricating a bipolar modified isoplanar integrated circuit structure including a substrate of semiconductor material of first conductivity type, an epitaxial layer of semiconductor material of second conductivity type deposited over the substrate and buffer or protective dielectric layers formed overlying the epitaxial layer, comprising:

defining the isolation oxide regions by masking and etching the overlying dielectric layers forming an isolation oxide mask;

etching the epitaxial layer through the isolation oxide mask to a level above the interface between the epitaxial layer and substrate leaving a thin layer of epitaxial semiconductor material lining the isolation oxide regions between epitaxial islands;

filling the isolation oxide regions in a two step process by growing a thin thermal isolation oxide layer at elevated temperatures from the thin layer of epitaxial semiconductor material thereby limiting encroachment of thermal isolation oxide into the epitaxial islands, and depositing low temperature isolation oxide over the thin thermal isolation oxide layer;

forming collector sink regions of semiconductor material of second conductivity type in the epitaxial islands;

forming base regions of semiconductor material of semiconductor material of first conductivity type in the epitaxial islands spaced from the collector sink regions;

depositing a polycrystalline layer of semiconductor material over the substantially isoplanar epitaxial islands and isolation oxide regions;

blanket implanting the polycrystalline layer with a dopant material forming polycrystalline layer of semiconductor material of high resistance across the integrated circuit structure;

growing a blanket polyoxide layer over the polycrystalline layer;

defining emitter, collector, and resistor contact locations by masking and etching the polyoxide layer thereby forming an emitter, collector, and resistor contacts implant mask;

implanting through the emitter, collector, and resistor contacts implant mask formed by the polyoxide layer into the polycrystalline layer with dopant material forming emitter, collector, and resistor contact locations of semiconductor material of low resistance in the polycrystalline layer;

capping the polycrystalline layer with a dielectric barrier layer;

defining areas of the polycrystalline layer to be retained and to be removed by masking and etching the dielectric barrier layer thereby forming a poly-definition mask;

etching away exposed portions of the polycrystalline layer through the poly-definition mask leaving resistor regions of high resistance and emitter, collector, and resistor contact locations of low resistance, said etching away of exposed portions of the polycrystalline layer exposing base region contact locations and ground contact locations on a lower surface level formed by the epitaxial layer, with said emitter, collector, and resistor contact locations being on an upper surface level formed by the polycrystalline layer;

forming an etch stop layer over exposed semiconductor material contact locations on the lower and upper surface levels;

depositing a blanket conformal spacer layer of dielectric material of substantially uniform thickness over the integrated circuit structure including the lower and upper surface levels, and step locations between the levels;

anisotropically etching the spacer layer in the direction orthogonal to the surface levels of the integrated circuit structure using a blanket unidirectional anisotropic etch, etching to the etch stop layer over the semiconductor material contact locations at the lower and upper surface levels, and leaving spacer shoulders of dielectric material from the spacer layer at the step locations between surface levels thereby dielectrically isolating and separating contact locations on the two levels adjacent to the step locations with minimum spacing between the contact locations.

5. The method of claim 1 further comprising the steps of:

removing the etch stop layer thereby exposing the contact locations at the lower and upper surface levels;

sputtering a layer of refractory metal reactive with the semiconductor material of the contact locations over the lower and upper surface levels;

sintering and reacting the layer of refractory metal with the semiconductor material forming a low resistance silicide layer over the contact locations on the lower and upper surface levels; and stripping unreacted refractory metal from spacer shoulders between contact locations to be isolated and separated thereby leaving isolated and separated low resistance contact locations.

6. The method of claim 1 wherein the step of defining areas of the polycrystalline layer to be retained and to be removed includes defining polycrystalline islands to be retained for transfer contact locations adjacent to contact locations on the lower surface level, wherein the step of etching away exposed portions of the polycrystalline layer further leaves polycrystalline islands providing transfer contact locations at the upper surface level for electrical transfer of contact locations from the lower surface level epitaxial layer, the further steps after anisotropically etching the spacer layer comprising:

removing the etch stop layer thereby exposing the contact locations at the lower and upper surface levels;

forming a layer of refractory metal reactive with the semiconductor material of the contact locations over the lower and upper surface levels;

sintering and reacting the layer of refractory metal with the semiconductor material, forming a conductive silicide layer over the contact locations on the lower and upper surface levels; and selectively masking and etching the formed layer of refractory metal, removing unreacted refractory metal from spacer shoulders between contact locations to be isolated and separated and leaving conductive refractory metal strips or bridges between the silicide layer of contact locations on the lower surface level and transfer contact locations on the upper surface level provided by adjacent polycrystalline islands thereby constituting all contact locations for elements of the integrated surface structure on substantially the same upper surface level provided by the polycrystalline layer.

7. The method of claim 4 wherein the refractory metal reactive with the semiconductor material comprises titanium.

8. An enhanced density single polycrystalline layer semiconductor process for fabricating a bipolar modified isoplanar integrated circuit structure having a substrate of semiconductor material of first conductivity type, an epitaxial layer of semiconductor material of second conductivity type deposited over the substrate, said epitaxial layer being subdivided into a plurality of epitaxial islands, pedestals, or mesas, isolation oxide regions surrounding and isolating the epitaxial islands, said isolation oxide regions being substantially isoplanar with the epitaxial islands, collector sink regions of semiconductor material of second conductivity type formed in the epitaxial islands, base regions of semiconductor material of first conductivity type formed in the epitaxial islands spaced from the collector sink regions, and a polycrystalline layer of semiconductor material deposited over the substantially isoplanar epitaxial islands and isolation oxide regions, said polycrystalline layer being implanted to provide semiconductor material regions of high resistance and low resistance in the polycrystalline layer said polycrystalline layer being capped with a dielectric barrier layer, the method for defining and completing transistor resistor and related circuit elements in the integrated circuit structure comprising:

defining areas of the polycrystalline layer to be retained and to be removed by masking and etching the dielectric barrier layer thereby forming a poly-definition mask;

etching away exposed portions of the polycrystalline layer through the poly-definition mask leaving polycrystalline layer resistor regions of semiconductor material of high resistance, polycrystalline islands, and emitter, collector, and resistor contact locations of semiconductor material of low resistance, said step of etching away exposed portions of the polycrystalline layer exposing base region contact locations and ground contact locations on a lower surface level formed by the epitaxial layer, said emitter, collector, and resistor contact locations comprising contact locations on the upper surface level formed by the polycrystalline layer, said polycrystalline islands providing transfer contact locations at the upper surface level for transferring contact locations from the lower surface level epitaxial layer;

forming an etch stop layer over exposed semiconductor material contact locations on the lower and upper levels;

depositing a blanket conformal spacer layer of dielectric material of substantially uniform thickness over the integrated circuit structure including the lower and upper surface levels, and the step locations between the levels;

anisotropically etching the spacer layer in the direction orthogonal to the surface levels of the integrated circuit structure using a blanket unidirectional anisotropic etch, etching to the etch stop layer over the semiconductor material contact locations of the lower and upper surface levels, and leaving spacer shoulders of dielectric material from the spacer layer at the step locations between surface levels thereby dielectrically isolating and separating contact locations on the two surface levels adjacent to the step locations with minimum spacing between the contact locations;

removing the etch stop layer thereby exposing the contact locations at the two surface levels;

forming a layer of refractory metal reactive with the semiconductor material over the lower and upper surface levels;

sintering and reacting the layer of refractory metal with exposed semiconductor material forming a low resistance silicide layer over the exposed semiconductor material contact locations on the lower and upper levels, and a layer of unreacted refractory metal over dielectric surfaces; and selectively masking and stripping the sputtered layer of refractory metal, removing unreacted refractory metal from spacer shoulders between contact locations to be isolated and separated and leaving conductive metal strips or bridges over spacer shoulders between contact locations on the lower surface level and transfer contact locations on the upper surface level provided by adjacent polycrystalline islands thereby constituting all contact locations for elements of the integrated circuit structure on substantially the same upper surface level of the polycrystalline layer.

9. The method of claim 6 further comprising the steps of forming a metal contact mask dielectric layer over the integrated surface structure and masking and etching said dielectric layer to form a metal contact mask for establishing metal layer contacts at the contact locations constituted on the upper surface level of the polycrystalline layer.

10. An enhanced density single polycrystalline layer process for fabricating a bipolar modified isoplanar integrated circuit structure including resistor and transistor elements having contact locations on a lower surface level semiconductor material epitaxial layer, and contact locations on an upper surface level semiconductor material polycrystalline layer, with step locations between the upper and lower surface levels, the method for transferring contact locations from the lower surface level to the upper surface level comprising:

forming polycrystalline islands during fabrication of the integrated circuit structure adjacent to contact locations on the lower surface level;

exposing the contact locations on the lower and upper surface levels;

forming a layer of refractory metal reactive with the semiconductor material over the lower and upper surface levels;

sintering and reacting the layer of refractory metal with the semiconductor material at the contact locations forming a low resistance layer over the contact locations on the lower and upper surface levels; and selectively masking and stripping the formed layer of refractory metal removing unreacted refractory metal between contact locations to be isolated and separated and leaving conductive metal strips or bridges between contact locations on the lower surface level and transfer contact locations on the upper surface level provided by adjacent polycrystalline islands thereby constituting contact locations for elements of the integrated circuit structure from different levels on substantially the same upper surface level of the polycrystalline layer.

11. The process of claim 8 comprising the further step of forming dielectric material spacers shoulders between adjacent contact locations at the step locations between lower and upper surface levels and leaving the conductive metal strips or bridges between contact locations on the lower surface level and transfer contact locations on the upper surface level over said spacer shoulders.

* * * * *